United States Patent [19]
Lane

[11] Patent Number: 5,204,275
[45] Date of Patent: Apr. 20, 1993

[54] METHOD FOR FABRICATING COMPACT BIPOLAR TRANSISTOR

[75] Inventor: Richard H. Lane, Hillsboro, Oreg.

[73] Assignee: North American Philips Corp., New York, N.Y.

[21] Appl. No.: 633,906

[22] Filed: Dec. 26, 1990

[51] Int. Cl.$^5$ ............................................. H01L 21/265
[52] U.S. Cl. ...................................... 437/31; 437/162; 437/909; 148/DIG. 123; 148/DIG. 10
[58] Field of Search ...................... 437/31, 162, 3, 909; 148/DIG. 10, DIG. 11, DIG. 123

[56] References Cited

U.S. PATENT DOCUMENTS

| 4,641,170 | 2/1987 | Ogura et al. | 357/35 |
| 4,678,537 | 7/1987 | Ohuchi | 437/31 |
| 4,712,125 | 12/1987 | Bhatia et al. | 357/59 |
| 4,722,908 | 2/1988 | Burton | 437/31 |
| 4,722,909 | 2/1988 | Burton | 437/31 |
| 4,889,823 | 12/1989 | Bertagnolli et al. | 437/31 |

FOREIGN PATENT DOCUMENTS

| 0258147 | 3/1988 | European Pat. Off. | |
| 0223160 | 11/1982 | Japan. | |
| 0220968 | 12/1984 | Japan. | |
| 0216580 | 10/1985 | Japan. | |
| 0216581 | 10/1985 | Japan. | |
| 0237466 | 10/1986 | Japan. | 437/31 |
| 0243361 | 10/1987 | Japan. | |

Primary Examiner—Brian E. Hearn
Assistant Examiner—Tuan Nguyen
Attorney, Agent, or Firm—David Schreiber

[57] ABSTRACT

A process for fabricating a compact bipolar transistor structure is disclosed which eliminates the need for a field oxide isolation region between the collector contact region and emitter of the transistor. An island of non-monocrystalline silicon is formed on top of the transistor structure partially covering the base and collector contact regions. Ribbons of non-insulating material are formed along the sidewalls of the island. The ribbon over the base region is employed to form a narrow emitter region with an annealing step that drives dopant from the ribbon or island into the portion of the base region below the ribbon. An insulating layer is disposed between the transistor structure and the island and ribbon over the collector contact region to insulate the emitter from the collector. Insulating sidewall spacers are formed next to the sidewall ribbons to insulate silicide regions grown over the base region, island and collector contact region for the three transistor contacts.

15 Claims, 4 Drawing Sheets

METHOD FOR FABRICATING COMPACT BIPOLAR TRANSISTOR

BACKGROUND OF THE INVENTION

The present invention relates in general to a process for fabricating a compact bipolar transistor which eliminates the need for an isolation field oxide region between the emitter and collector of the transistor.

Silicon bipolar transistors are often fabricated using a process in which separate portions of a single polycrystalline silicon layer form the contacts to the transistor's collector, base and emitter. To increase the switching speed of the transistor, the emitter must be made as small as possible to reduce parasitic capacitances in the transistor. Photolithographic techniques place inherent lower limits on the device dimensions that can be obtained. Non-photolithographic techniques have therefore been sought to reduce the device dimensions.

An example of one such technique is illustrated in U.S. Pat. No. 4,722,908 to Burton which discloses a bipolar transistor fabrication process in which polysilicon sidewalls are formed that serve both as dopant sources for the formation of underlying base and emitter regions, and as contacts for those devices. The thickness of the polysilicon sidewalls is precisely controllable through conventional polysilicon deposition techniques and determines the widths of the underlying device regions. Device widths of approximately 0.05 micron are obtainable using this process which is a very substantial improvement over the approximate 1 micron limit obtainable using conventional photolithographic techniques.

The process set forth in the Burton patent has a number of drawbacks. First, the design requires that an additional isolation field oxide region be formed between the collector contact region and the emitter of the transistor to prevent a short circuit between the two. This results in a structure that is not particularly compact. Second, the same polysilicon sidewall technique that is used to form the narrow emitter is also used to form the base contact. As a result, the base contact is also narrow which increases its resistance. Thus, there is a trade off between the increased operation speed realized from the narrow emitter and the undesirable increase in resistance of the base contact.

SUMMARY OF THE INVENTION

In view of the foregoing, it is therefore an object of the present invention to provide an improved bipolar fabrication process which results in a compact transistor structure.

It is another object of the present invention to provide an improved bipolar transistor fabrication process in which certain important device dimensions are made quite small by establishing them in a way that is not photolithographic dependent.

These and other objects of the invention are achieved with a bipolar transistor fabrication process which eliminates the need for an isolation field oxide region between the collector and the emitter, thereby reducing the size of the transistor considerably.

In the process, a collector contact region is formed (at least partly) in an active monocrystalline semiconductor portion of a substrate, and then a layer of insulating material is formed over the substrate. An island of non-insulating material is formed over a part of the insulating layer, and a surface-adjoining base region is formed in a part of the active portion not covered by the island.

A thin ribbon of non-insulating material is formed along a first sidewall of the island and contacts the base region. This ribbon is employed to form a surface-adjoining emitter region in a part of the base region beneath the ribbon.

The remaining portion of the insulating layer beneath the island of non-insulating material and a second sidewall ribbon of non-insulating material above the collector contact region electrically insulates the emitter and collector regions from one another and eliminates the need for an isolation region in the substrate between the two. This results in a transistor structure that is considerably more compact than, for example, the structure set forth in the Burton patent. In addition, the thin sidewall ribbons used to form the emitter region are not employed in the formation of the base contact so that the base contact is still relatively large and its resistance is low.

BRIEF DESCRIPTION OF THE DRAWINGS

The foregoing and additional objects, features and advantages of the present invention will become more apparent from the following detailed description of a preferred embodiment thereof, taken in conjunction with the accompanying drawings in which.

DETAILED DESCRIPTION OF A PREFERRED EMBODIMENT

Figure 1:
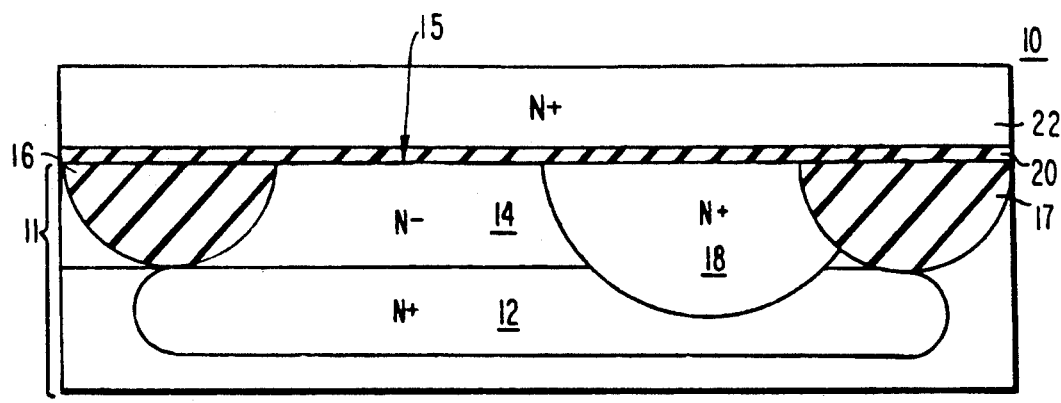
FIGS. 1–11 are cross-sectional side views of a silicon substrate illustrating the sequential fabrication steps of a bipolar transistor in accordance with the present invention.

Turning now to a more detailed consideration of the present invention, FIGS. 1–11 illustrate the fabrication steps employed in forming a compact bipolar transistor structure 10 in accordance with the present invention. In particular, FIG. shows a monocrystalline silicon substrate in which is formed, by conventional techniques, an n+ buried layer 12 that serves as a buried collector region. Formed on top of the silicon substrate 11 and buried layer 12 is an n-epitaxial layer that includes an active monocrystalline silicon device portion 14 having a largely planar upper surface 15. A planarized annular isolation field oxide region, of which FIG. 1 shows first and second portions 16 and 17, laterally surrounds the active device portion 14.

An n+ collector contact region 18 is provided in the active portion 14 next to the isolation field oxide portion 17. The collector contact region 18 extends from the upper surface 15 through the active region 14 down to the buried collector region 12.

A layer of silicon dioxide 20 is deposited or thermally grown along the upper surface 15. If the layer 20 is thermally grown, only minimal coverage of the field oxide portion 16 and 17 by the layer 20 will occur. It should be noted therefore that the illustration in FIGS. 1–9 of the thickness of the layer 20 over the portions 16 and 17 is considerably exaggerated in that instance.

It should be noted that, in the process of forming the layer of silicon dioxide 20, a small part of the upper surface 15 will be removed. Literally speaking then, when the collector contact region 18 is formed adjoining the upper surface 15, it is not the same upper surface that the collector contact region 18 adjoins after the formation of the silicon dioxide layer 20. For purposes of this description, however, the upper surface 15 is defined to be whatever upper surface of the active portion 14 is present at the time a particular step of the fabrication process is carried out.

A layer of non-monocrystalline silicon (amorphous silicon or polysilicon) 22 is deposited overtop the silicon dioxide layer 20. Non-monocrystalline silicon layer 22 is preferably doped with an n+ impurity, such as arsenic, for reasons to be discussed below.

Figure 2:
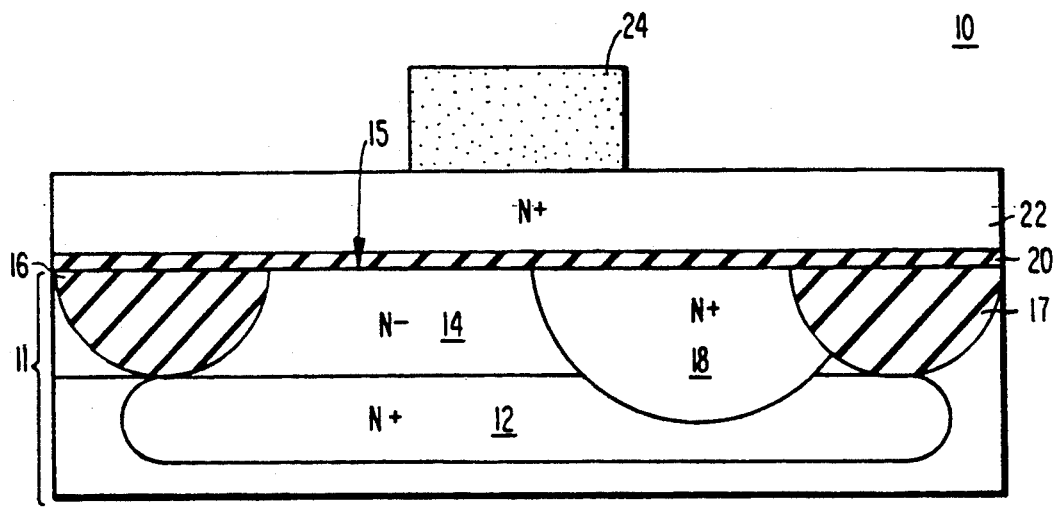
Figure 3:
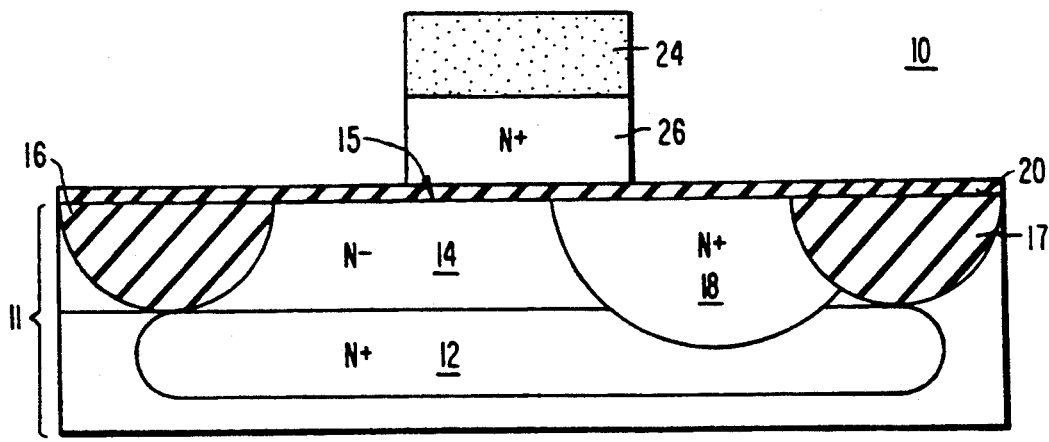

Next, as illustrated in FIG. 2, a conventional photoresist masking step is employed to form a centrally disposed photoresist island 24 over the non-monocrystalline silicon layer 22. The non-monocrystalline silicon layer 22 is then etched as illustrated in FIG. 3 and the photoresist island 24 is stripped to form a centrally located non-monocrystalline silicon island 26.

Figure 4:
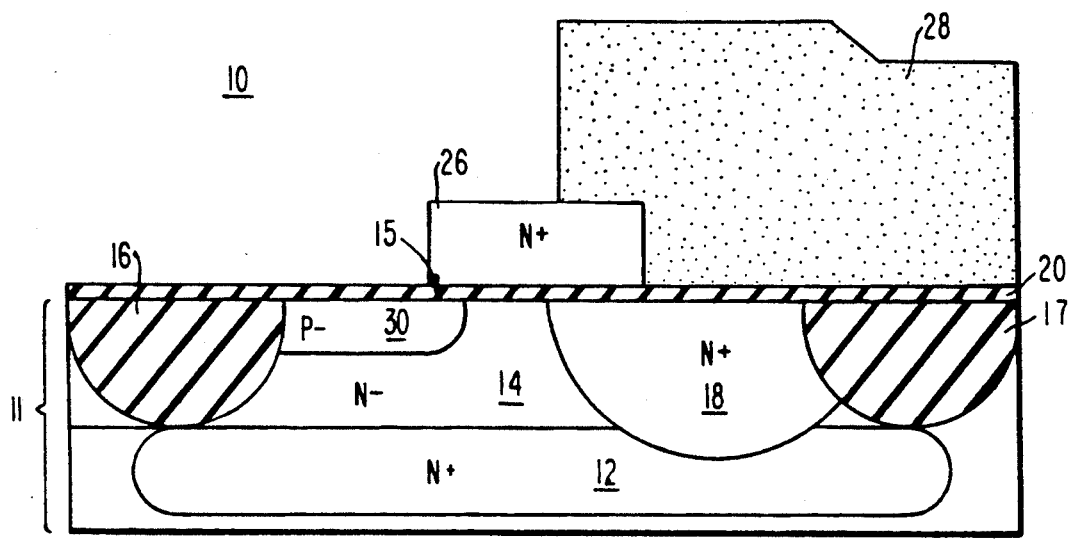

Turning now to FIG. 4, another photoresist masking step is employed to form a layer of photoresist 28 over a portion of the non-monocrystalline silicon island 26 and the collector contact region 18 to act as a mask for a base implant. A dopant is then implanted into the active portion 14 to form a p- base region 30 therein adjoining the upper surface 15. The dopant dose is light enough to avoid any affect on the n+ non-monocrystalline silicon island 26. As shown in FIG. 4, n-material of the active portion 14 laterally separates the base region 30 from the collector contact region 18.

Figure 5:
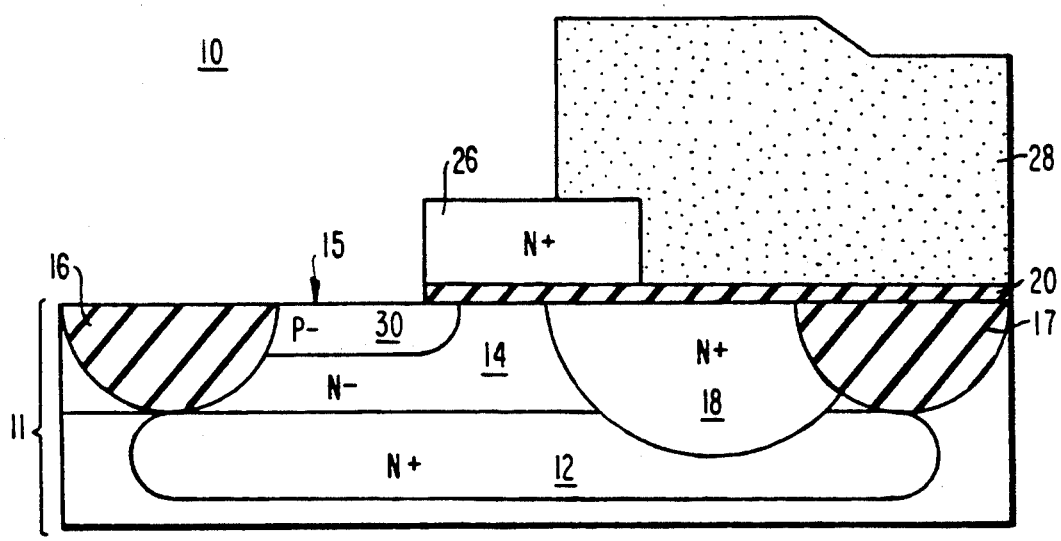

Next, as illustrated in FIG. 5, the portion of the silicon dioxide layer 20 over the base region 30 is etched and removed with a dry etch that does not etch the non-monocrystalline silicon island 26. It should be noted that the steps illustrated in FIGS. 4 and 5 could be reversed if desired, so that the base region 30 is formed after the etch of the silicon dioxide layer 20.

Figure 6:
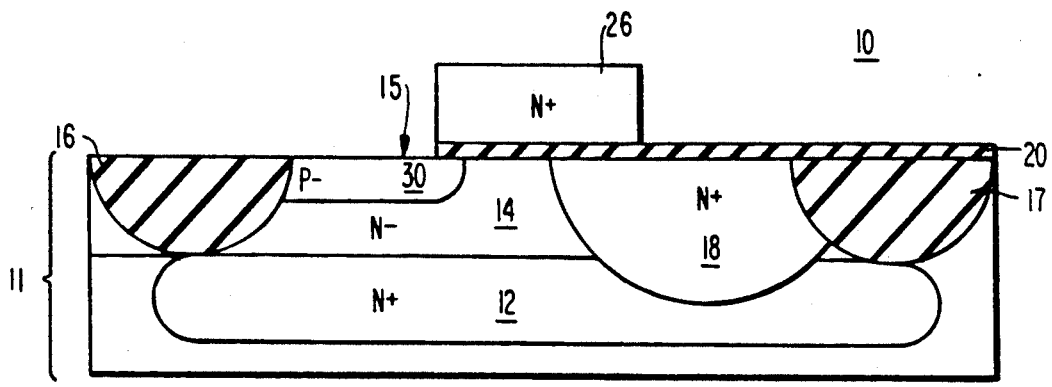

The photoresist layer 28 is next stripped as illustrated in FIG. 6, and the device is exposed to a short or rapid thermal anneal to activate the ions in the doped base region 30.

Figure 7:
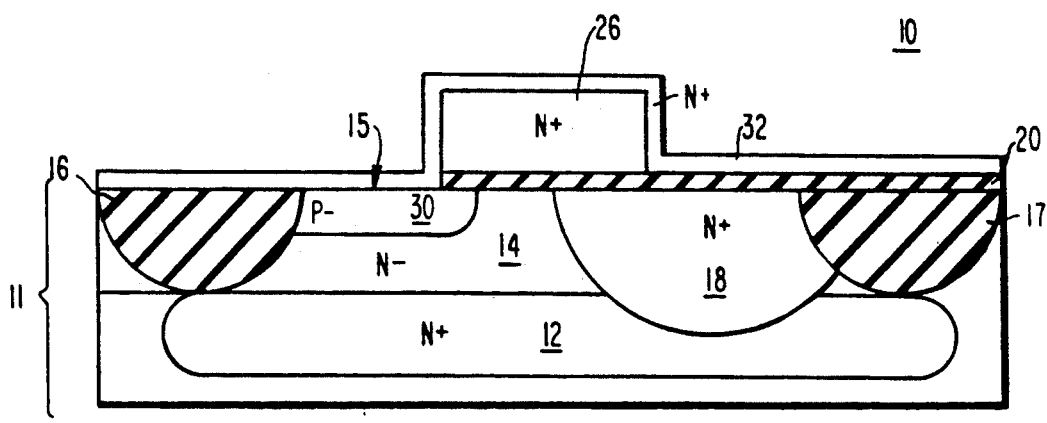

Turning now to FIG. 7, the next step is to deposit a thin layer of non-monocrystalline silicon 32 with a thickness ranging between 200 and 5000 angstroms over the entire top surface of the transistor structure 10. Non-monocrystalline layer 32 may be doped with an n+ dopant, such as arsenic, if the island 26 is not so doped.

Figure 8:
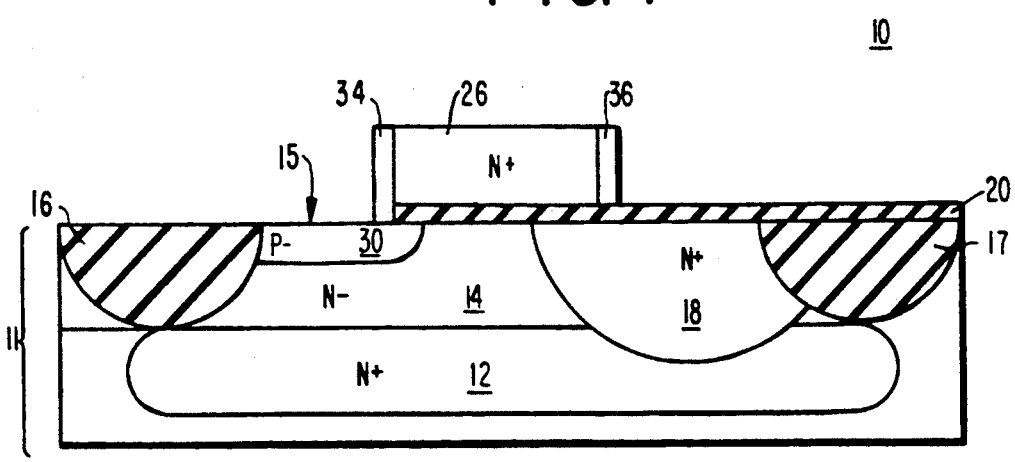

Next as illustrated in FIG. 8, all the horizontal portions of the thin non-monocrystalline silicon layer 32 and any underlying remaining portions of the silicon dioxide layer 20 are anisotropically etched to form first and second non-monocrystalline silicon sidewall ribbons 34 and 36 along the sidewalls of the island 26. The first sidewall ribbon 34 extends into contact with the base region 30, while the sidewall ribbon 36 extends only into contact with the silicon dioxide layer 20. The sidewall ribbons 34 and 36 are then annealed to drive the arsenic doping in either the island 26 or first sidewall ribbon 34 into the base region 30 and thereby form an n+ emitter region 40 adjoining the upper surface 15 whose size is directly proportional to the thickness of the first sidewall ribbon 34.

Figure 9:
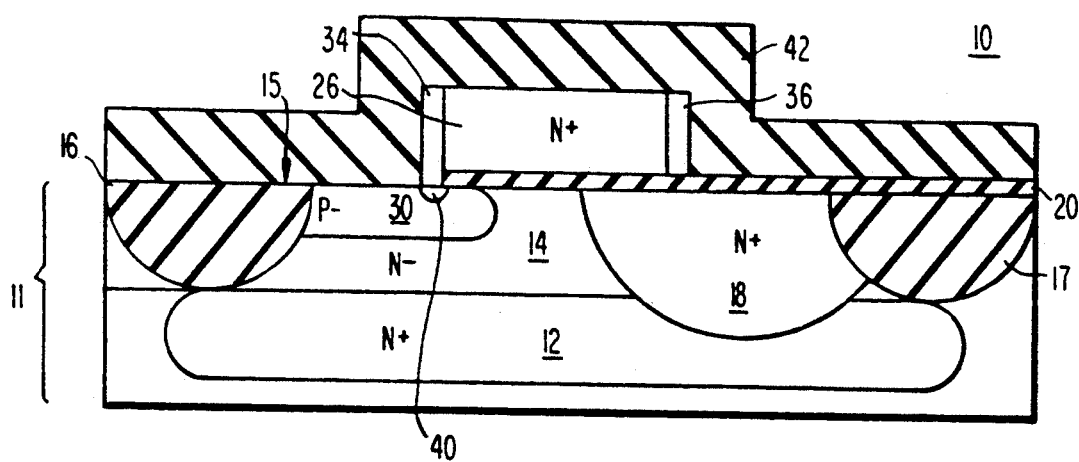
Figure 10:
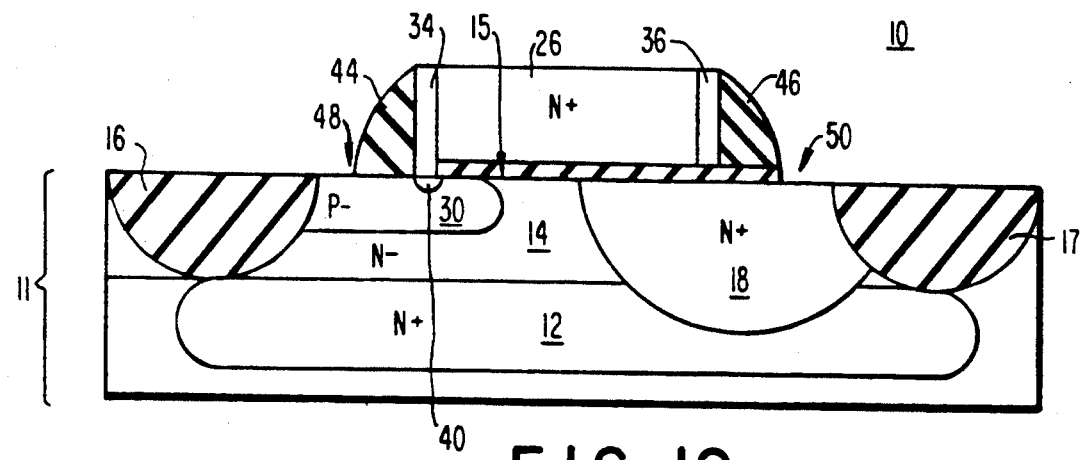
Figure 11:
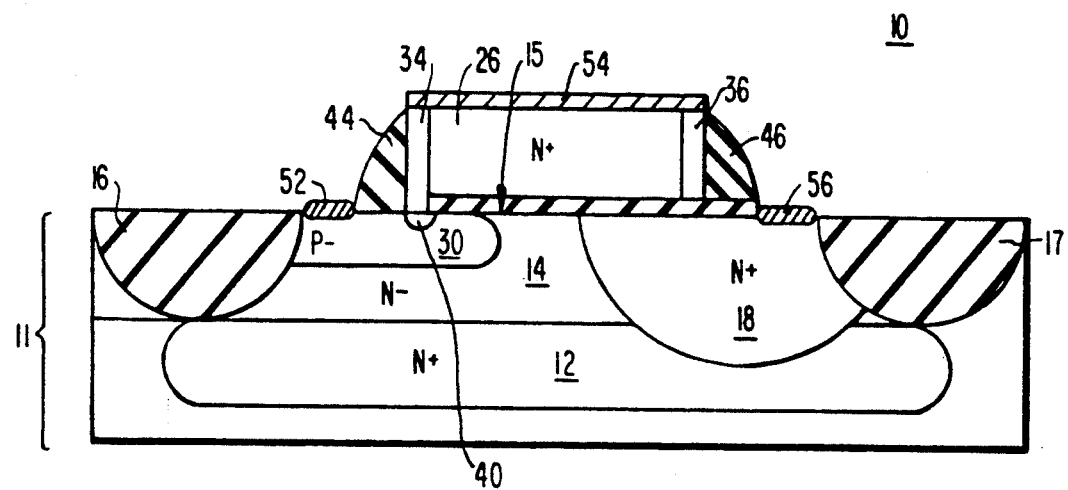

The final steps of the process as illustrated in FIGS. 9-11 are employed to define and form contacts for the transistor structure 10. First, a thick conformal dielectric layer 42 of silicon dioxide or silicon nitride is deposited over the top surface of the transistor structure 10, and is plasma etched along with any underlying portions of the silicon dioxide layer 20. The plasma etch does not etch any of the various silicon layers and leaves first and second sidewall insulating spacers 44 and 46. This leaves an exposed portion 48 of the base region 30 between the first portion 16 of the isolation field oxide region and the first spacer 44, and an exposed portion 50 of the collector contact region 18 between the second space 46 and the second portion 17 of the isolation field oxide region. The sizes of the exposed portions 48 and 50 are therefore determined by the respective thicknesses of the spacers 44 and 46.

A conventional metallization formation process, such as silicide, is next employed to form a plurality of metallization regions 52, 54 and 56 over the exposed portions of the base region 30, island 26 and collector contact region 18, respectively, for subsequent formation of the base, emitter and collector contacts. The steps of a silicide process include a blanket deposition of metal over the entire substrate 11, followed by a sintering step to cause the metal to react with the exposed silicon areas, thus forming silicide. Finally, the unreacted metal over the various insulating regions is selectively stripped leaving only the silicide regions.

The resulting bipolar transistor structure 10 is advantageous for a number of reasons. First, it is considerably more compact than previous structures because a centrally located field oxide region is not needed to insulate the collector from the emitter. Instead, the silicon dioxide layer 20 acts as insulation between the two. Also, the size of the base contact is not controlled by the width of the sidewall ribbon 34 employed to make the emitter region 40 so that the emitter region 40 can be made as small as possible without increasing the resistance of the base contact.

Although the invention has been disclosed in terms of a preferred embodiment, it will be understood that numerous modifications and variations could be made thereto without departing from the scope of the invention as claimed below. For example, although the disclosed embodiment relates to the fabrication of an NPN bipolar transistor, it will be readily apparent that the same process could be applied to the formation of PNP transistors. Also, although the preferred embodiment described herein relates to the formation of a vertical bipolar transistor having a buried collector region, it will be understood that the inventive concept could be applied to other transistor structures, such as a lateral device having no buried collector region.

I claim:

1. A method for fabricating a bipolar transistor comprising the steps of:

a) forming a collector region in a substrate that comprises an active monocrystalline semiconductor portion having an upper surface, said collector region comprising a collector contact region adjoining said surface and situated at least partly in said active portion;

b) forming an insulating layer along said upper surface of said active portion;

c) forming an island of non-insulating material over a part of said insulating layer;

d) subsequently performing an operation (a) to form a base region adjoining said upper surface in a part of said active portion laterally contiguous with said collector contact region or laterally separated from said collector contact region substantially fully b monocrystalline semiconductor material of said active portion and (b) to remove an exposed part of said insulating layer extending over the location for said base region;

e) forming a first ribbon of non-insulating material along a first sidewall of said island such that said first ribbon contacts said active portion along said base region; and f) forming an emitter region adjoining said upper surface in a part of said base region beneath said first ribbon.

2. The method of claim wherein said emitter region is laterally separated from said collector contact region substantially fully by monocrystalline semiconductor material of said active portion, including part of said base region.

3. The method of claim 1 wherein said upper surface of said active portion is largely planar.

4. The method of claim 3 including the step of forming a second ribbon of non-insulating material along a second sidewall of said island such that said second ribbon is separated from said active portion by at least said insulating layer, said second ribbon being closer to said collector contact region than said first ribbon.

5. The method of claim 4 wherein the step of forming first and second ribbons of non-insulating material further comprises:
   i) depositing a thin layer of non-insulating material over said substrate, island and insulating layer; and
   ii) anisotropically etching said thin layer until only said first and second ribbons remain along said first and second sidewalls, respectively, of said island.

6. The method of claim 4 wherein said ribbons and said island consist principally of non-monocrystalline semiconductor material.

7. The method of claim 6 including the step of forming first and second dielectric spacers respectively adjacent to said first and second ribbons and respectively situated above parts of said base region and said collector contact region.

8. The method of claim 7, wherein the step of forming first and second dielectric spacers further comprises:
   i) forming a dielectric layer over said substrate, island and insulating layer; and
   ii) etching said dielectric and insulating layers and thereby forming said first and second dielectric spacers.

9. The method of claim 7 including the step of forming emitter, base and collector metallization regions, respectively, to said island and to parts of said base region and said collector contact region not covered by said spacers.

10. The method of claim 9 wherein said metallization regions are formed by a silicide formation process.

11. The method of claim 6 including the step of providing an annular dielectric isolation region that laterally surrounds said active portion.

12. The method of claim 11 wherein said collector region includes a buried collector region situated within said substrate contiguous with said collector contact region and extending below said base region.

13. The method of claim 1 wherein said first ribbon includes a dopant and wherein the step of forming an emitter region further comprises annealing said substrate and thereby causing said dopant in said first ribbon to be driven into said base region to form said emitter region.

14. The method of claim 1 wherein said island includes a dopant and wherein the step of forming an emitter region further comprises annealing said substrate and thereby causing said dopant in said island to be driven through said first ribbon into said base region to form said emitter region.

15. The method of claim 1 wherein the steps of forming an insulating layer and an island of non-insulating material further comprise:
   i) forming an insulating layer over an upper surface of said substrate;
   ii) forming a non-monocrystalline silicon layer over said insulating layer;
   iii) forming a centrally located island of photoresist over a portion of said non-monocrystalline silicon layer;
   iv) etching all exposed portions of said non-monocrystalline silicon layer to thereby form said island;
   v) forming photoresist over a portion of said insulating layer over said collector region;
   vi) etching all exposed portions of said insulating layer; and
   vii) removing all remaining photoresist.

* * * * *